(12) United States Patent
Gong et al.

(10) Patent No.: US 9,093,457 B2
(45) Date of Patent: Jul. 28, 2015

(54) STACKED MICROELECTRONIC PACKAGES HAVING PATTERNED SIDEWALL CONDUCTORS AND METHODS FOR THE FABRICATION THEREOF

(75) Inventors: Zhiwei Gong, Chandler, AZ (US); Michael B Vincent, Chandler, AZ (US); Scott M Hayes, Chandler, AZ (US); Jason R Wright, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 13/591,969

(22) Filed: Aug. 22, 2012

(65) Prior Publication Data

US 2014/0054796 A1    Feb. 27, 2014

(51) Int. Cl.
*H01L 21/30* (2006.01)
*H01L 23/538* (2006.01)
(Continued)

(52) U.S. Cl.
CPC .......... *H01L 23/5389* (2013.01); *H01L 21/561* (2013.01); *H01L 21/78* (2013.01); *H01L 23/3128* (2013.01); *H01L 23/48* (2013.01); *H01L 23/49805* (2013.01); *H01L 24/24* (2013.01); *H01L 24/82* (2013.01); *H01L 24/96* (2013.01); *H01L 25/105* (2013.01); *H01L 23/49838* (2013.01); *H01L 24/48* (2013.01); *H01L 2224/24145* (2013.01); *H01L 2224/48091* (2013.01); *H01L 2924/00014* (2013.01); *H01L 2924/1461* (2013.01); *H01L 2924/18165* (2013.01)

(58) Field of Classification Search
CPC ................. H01L 2224/97; H01L 2224/73265; H01L 25/0657

USPC ......... 257/686–690, 723, 734, 735, 773–780, 257/E23.141–E23.179, E21.001
See application file for complete search history.

(56) References Cited

U.S. PATENT DOCUMENTS 4,866,501 A * 9/1989 Shanefield .................... 257/684
5,019,946 A   5/1991 Eichelberger et al.
(Continued)

OTHER PUBLICATIONS

Rabaey, J. et al., Digital Integrated Circuits. 2003, Pearson Education, Second Edition, 38-40.*
(Continued)

*Primary Examiner* — Thao X Le
*Assistant Examiner* — Gardner W Swan
(74) *Attorney, Agent, or Firm* — Ingrassia Fisher & Lorenz, P.C.

(57) ABSTRACT

Embodiments of a method for fabricating stacked microelectronic packages are provided, as are embodiments of a stacked microelectronic package. In one embodiment, the method includes arranging microelectronic device panels in a panel stack. Each microelectronic device panel includes a plurality of microelectronic devices and a plurality of package edge conductors extending therefrom. Trenches are formed in the panel stack exposing the plurality of package edge conductors. An electrically-conductive material is deposited into the trenches and contacts the plurality of package edge conductors exposed therethrough. The panel stack is then separated into partially-completed stacked microelectronic packages. For at least one of the partially-completed stacked microelectronic packages, selected portions of the electrically-conductive material are removed to define a plurality of patterned sidewall conductors interconnecting the microelectronic devices included within the stacked microelectronic package.

13 Claims, 11 Drawing Sheets

(51) Int. Cl.
| | |
|---|---|
| H01L 21/78 | (2006.01) |
| H01L 23/48 | (2006.01) |
| H01L 23/31 | (2006.01) |
| H01L 23/498 | (2006.01) |
| H01L 21/56 | (2006.01) |
| H01L 25/10 | (2006.01) |
| H01L 23/00 | (2006.01) |

(56) References Cited

U.S. PATENT DOCUMENTS

| | | | |
|---|---|---|---|
| 5,279,991 A | | 1/1994 | Minahan et al. |
| 5,432,729 A | | 7/1995 | Carson et al. |
| 5,465,186 A | * | 11/1995 | Bajorek et al. ........... 360/323 |
| 5,675,180 A | | 10/1997 | Pedersen et al. |
| 5,847,448 A | * | 12/1998 | Val et al. ........... 257/686 |
| 5,977,640 A | | 11/1999 | Bertin et al. |
| 6,467,880 B2 | | 10/2002 | Rhodes |
| 6,560,109 B2 | | 5/2003 | Yamaguchi et al. |
| 6,607,941 B2 | | 8/2003 | Prabhu et al. |
| 6,818,977 B2 | | 11/2004 | Poo et al. |
| 6,822,191 B2 | | 11/2004 | De Steur et al. |
| 6,855,572 B2 | | 2/2005 | Jeung et al. |
| 7,394,152 B2 | | 7/2008 | Yu et al. |
| 7,560,215 B2 | | 7/2009 | Sharma et al. |
| 7,723,159 B2 | | 5/2010 | Do et al. |
| 7,732,907 B2 | | 6/2010 | Han et al. |
| 7,741,156 B2 | * | 6/2010 | Pagaila et al. ........... 438/113 |
| 7,759,800 B2 | | 7/2010 | Rigg et al. |
| 7,829,998 B2 | | 11/2010 | Do et al. |
| 7,838,979 B2 | | 11/2010 | Oh |
| 7,843,046 B2 | | 11/2010 | Andrews et al. |
| 7,951,649 B2 | | 5/2011 | Val |
| 7,972,650 B1 | | 7/2011 | Church et al. |
| 7,994,621 B2 | | 8/2011 | Kim |
| 8,012,802 B2 | | 9/2011 | Sasaki et al. |
| 8,247,268 B2 | | 8/2012 | Do et al. |
| 8,362,621 B2 | | 1/2013 | Lee et al. |
| 8,796,561 B1 | | 8/2014 | Scanlan et al. |
| 2002/0121702 A1 | * | 9/2002 | Higgins, III ........... 257/758 |
| 2003/0138610 A1 | | 7/2003 | Tao |
| 2006/0043569 A1 | | 3/2006 | Benson et al. |
| 2008/0274603 A1 | | 11/2008 | Do et al. |
| 2009/0039528 A1 | * | 2/2009 | Haba et al. ........... 257/777 |
| 2009/0134527 A1 | * | 5/2009 | Chang ........... 257/777 |
| 2009/0160065 A1 | * | 6/2009 | Haba et al. ........... 257/777 |
| 2009/0230533 A1 | | 9/2009 | Hoshino et al. |
| 2010/0001407 A1 | * | 1/2010 | Krause et al. ........... 257/774 |
| 2010/0140811 A1 | | 6/2010 | Leal et al. |
| 2010/0270668 A1 | | 10/2010 | Marcoux |
| 2010/0320584 A1 | | 12/2010 | Takano |
| 2011/0012246 A1 | | 1/2011 | Andrews, Jr. et al. |
| 2011/0037159 A1 | | 2/2011 | McElrea et al. |
| 2012/0119385 A1 | | 5/2012 | Co et al. |
| 2012/0187577 A1 | | 7/2012 | Cordes et al. |
| 2012/0193785 A1 | * | 8/2012 | Lin et al. ........... 257/737 |
| 2013/0010441 A1 | | 1/2013 | Oganesian et al. |
| 2013/0049225 A1 | | 2/2013 | Kang et al. |
| 2014/0054783 A1 | | 2/2014 | Gong et al. |
| 2014/0054797 A1 | | 2/2014 | Gong et al. |

OTHER PUBLICATIONS

USPTO, Final Office Action for U.S. Appl. No. 13/591,990, mailed Dec. 19, 2013.
USPTO, Office Action for U.S. Appl. No. 13/591,990, mailed Jul. 5, 2013.
U.S. Appl. 13/829,737, Office Action—Pre-Interview Communication (Pilot Program), mailed Aug. 14, 2014.
USPTO, Non-Final Office Action for U.S. Appl. No. 13/591,924, mailed Jul. 24, 2014.
U.S. Appl. No. 13/829,737, Yap, Weng F., et al., "Stacked Microelectronic Packages Having Sidewall Conductors and Methods for the Fabrication Thereof", filed Mar. 14, 2013, Office Action—Rejection, mailed May 23, 2014.
Non-Final Office Action mailed Feb. 12, 2015 for U.S. Appl. No. 14/097,459, 16 pages.
Restriction Requirement mailed Apr. 11, 2014 for U.S. Appl. No. 13/591,924, 9 pages.
Final Office Action mailed Nov. 19, 2014 for U.S. Appl. No. 13/591,924, 21 pages.
Restriction Requirement mailed Mar. 29, 2013 for U.S. Appl. No. 13/591,990, 4 pages.
Notice of Allowance mailed Jan. 8, 2015 for U.S. Appl. No. 13/591,990, 6 pages.
Non-Final Office Action mailed Nov. 18, 2014 for U.S. Appl. No. 13/906,621, 5 pages.
Final Office Action mailed Dec. 5, 2014 for U.S. Appl. No. 13/829,737, 10 pages.
Notice of Allowance mailed Feb. 3, 2015 for U.S. Appl. No. 14/042,628, 12 pages.
Restriction Requirement mailed Jan. 29, 2015 for U.S. Appl. No. 14/097,424, 8 pgs.
U.S. Appl. No. 13/591,924, filed Aug. 22, 2012, entitled "Stacked Microelectronic Packages Having Sidewall Conductors and Methods for the Fabrication Thereof".
U.S. Appl. No. 13/591,990, filed Aug. 22, 2012, entitled "Stacked Microelectronic Packages Having Sidewall Conductors and Methods for the Fabrication Thereof".
U.S. Appl. No. 13/829,737, filed Mar. 14, 2013, entitled "Stacked Microelectronic Packages Having Sidewall Conductors and Methods for the Fabrication Thereof".
U.S. Appl. No. 13/906,621, filed May 31, 2013, entitled "Stacked Microelectronic Packages Having Sidewall Conductors and Methods for the Fabrication Thereof".
U.S. Appl. No. 14/042,623, filed Sep. 30, 2013, entitled "Devices and Stacked Microelectronic Packages with Parallel Conductors and Intra-Conductor Isolator Structures and Methods of their Fabrication".
U.S. Appl. No. 14/042,628, filed Sep. 30, 2013, entitled "Devices and Stacked Microelectronic Packages with In-Trench Package Surface Conductors and Methods of Their Fabrication".
U.S. Appl. No. 14/097,424, filed Dec. 5, 2013, entitled "Devices and Stacked Microelectronic Packages with Package Surface Conductors and Methods of Their Fabrication".
U.S. Appl. No. 14/097,459, filed Dec. 5, 2013, entitled "Devices and Stacked Microelectronic Packages with Package Surface Conductors and Adjacent Trenches and Methods of Their Fabrication".
U.S. Appl. No. 14/573,519, filed Dec. 17, 2014, entitled "Microelectronic Devices with Mutli-Layer Package Surface Conductors and Methods of Their Fabrication".
Non-Final Office Action mailed Mar. 6, 2015 for U.S. Appl. No. 13/591,924, 8 pages.
Notice of Allowance mailed Feb. 17, 2015 for U.S. Appl. No. 13/591,990, 5 pages.
Notice of Allowance mailed Mar. 5, 2015 for U.S. Appl. No. 14/042,623, 14 pages.
Non-Final Office Action mailed Mar. 6. 2015 for U.S. Appl. No. 13/829,737, 11 pages.
USPTO, Office Action for U.S. Appl. No. 13/591,924 mailed Mar. 6, 2015.
Notice of Allowance mailed May 19, 2015 for U.S. Appl. No. 13/591,924, 8 Pages.
Final Office Action mailed May 12, 2015 for U.S. Appl. No. 13/906,621, 11 Pages.
Non-Final Office Action mailed May 22, 2015 for U.S. Appl. No. 14/097,424, 13 pages.

* cited by examiner

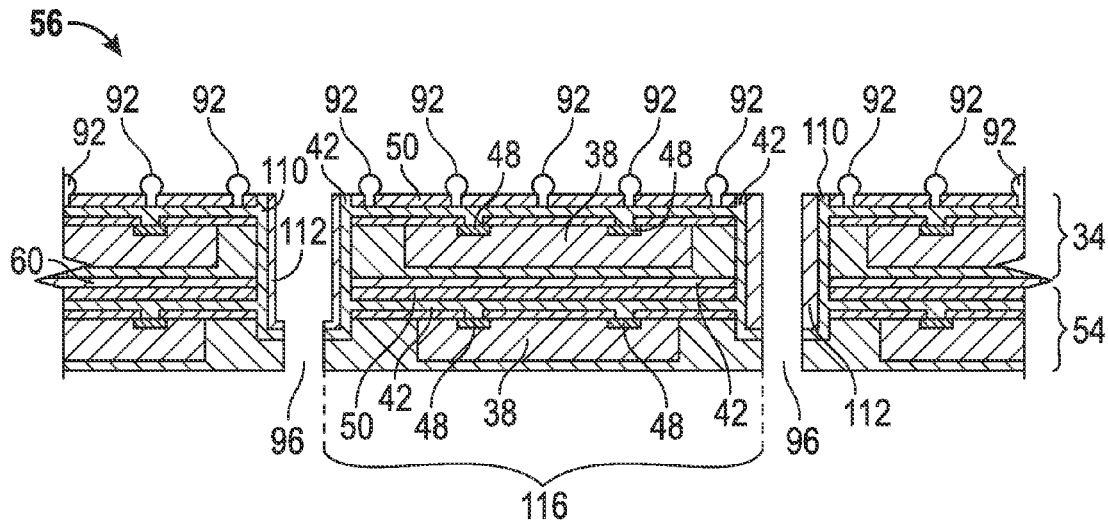
FIG. 15
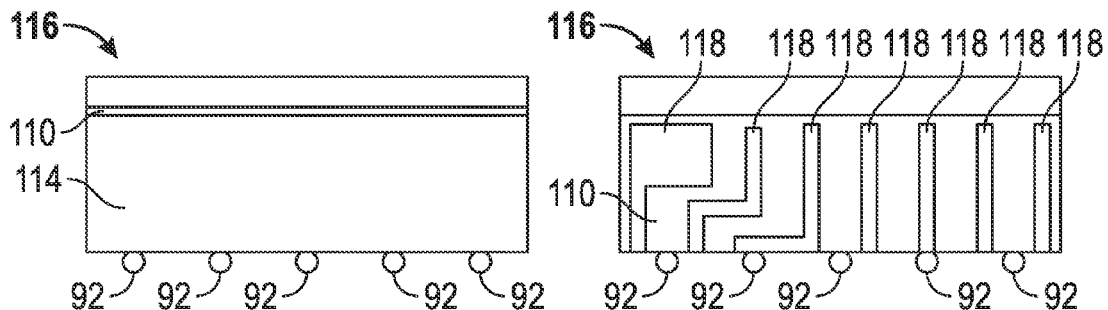
FIG. 16
FIG. 17
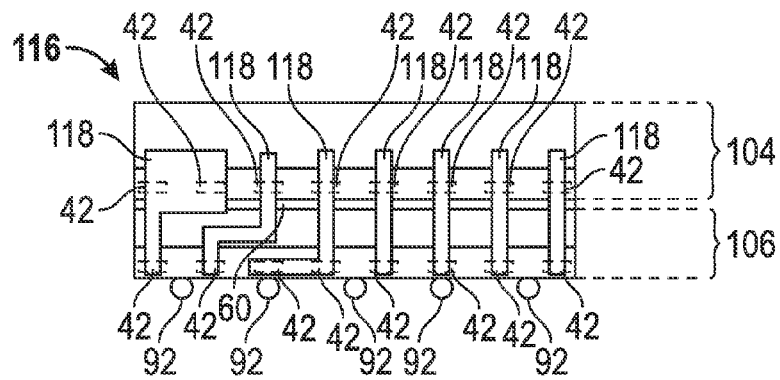
FIG. 18

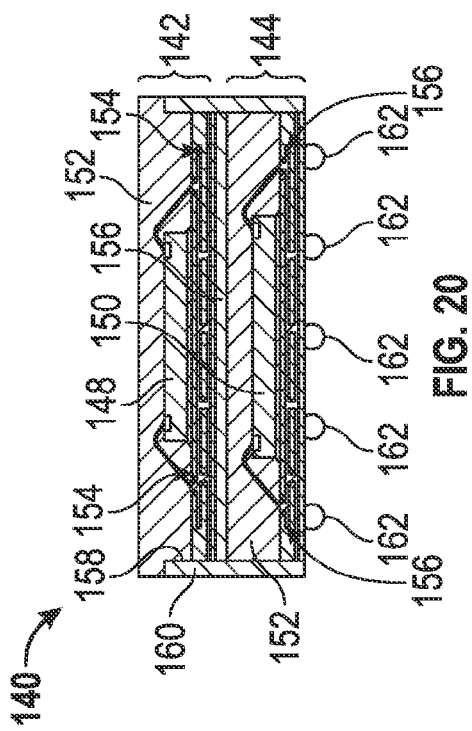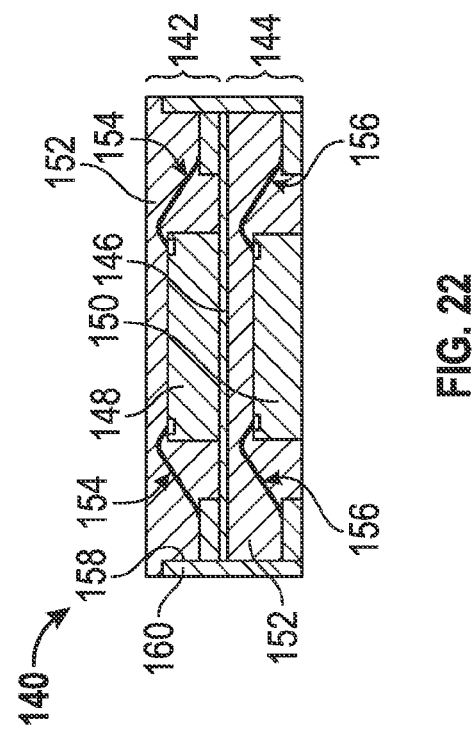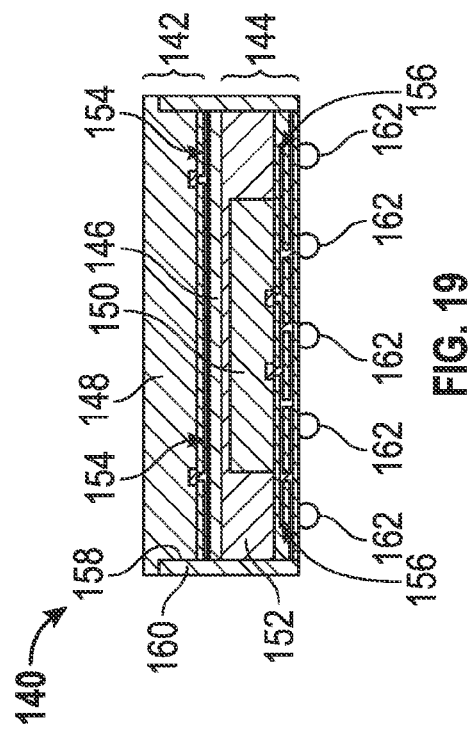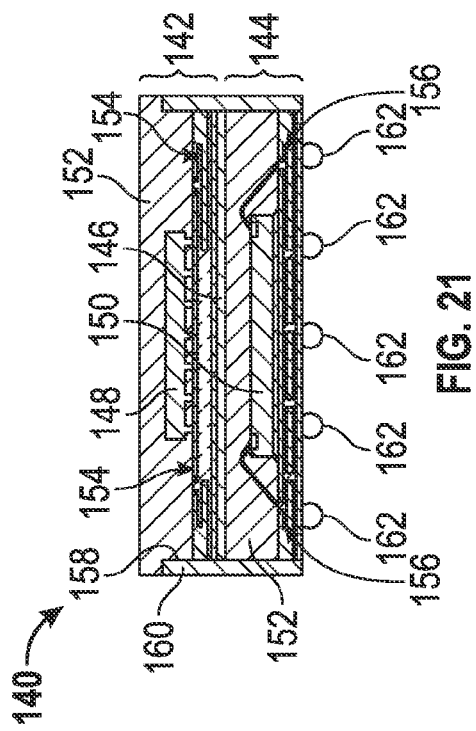
FIG. 19
FIG. 20
FIG. 21
FIG. 22

STACKED MICROELECTRONIC PACKAGES HAVING PATTERNED SIDEWALL CONDUCTORS AND METHODS FOR THE FABRICATION THEREOF

CROSS-REFERENCE TO RELATED APPLICATIONS

This application relates to the following co-pending applications, each of which is hereby incorporated by reference: U.S. application Ser. No. 13/591,924, filed with the United States Patent and Trademark Office (USPTO) on Aug. 22, 2012, and U.S. application Ser. No. 13/591,990, filed with USPTO on Aug. 22, 2012.

TECHNICAL FIELD

Embodiments of the present invention relate generally to microelectronic packaging and, more particularly, to stacked microelectronic packages having patterned sidewall conductors and methods for the fabrication thereof.

BACKGROUND

It is often useful to combine multiple microelectronic devices, such as semiconductor die carrying integrated circuits (ICs), microelectromechanical systems (MEMS), optical devices, passive electronic components, and the like, into a single package that is both compact and structurally robust. Packaging of microelectronic devices has traditionally been carried-out utilizing a so-called two dimensional (2D) or non-stacked approach in which two or more microelectronic devices are positioned and interconnected in a side-by-side or laterally adjacent spatial relationship. More particularly, in the case of ICs formed on semiconductor die, packaging has commonly entailed the mounting of multiple die to a package substrate and the formation of desired electrical connections through wire bonding or flip-chip (FC) connections. The 2D microelectronic package may then later be incorporated into a larger electronic system by mounting the package substrate to a printed circuit board (PCB) or other component included within the electronic system.

As an alternative to 2D packaging technologies of the type described above, three dimensional (3D) packaging technologies have recently been developed in which microelectronic devices are disposed in a stacked arrangement and vertically interconnected to produce a stacked, 3D microelectronic package. Such 3D packaging techniques yield highly compact microelectronic packages well-suited for usage within mobile phones, digital cameras, digital music players, and other compact electronic devices. Additionally, such 3D packaging techniques enhance device performance by reducing interconnection length, and thus signal delay, between the packaged microelectronic devices. Considerable efforts have been expended in the development of so-called "Package-on-Package" or, more simply, "PoP" packaging technologies. In a conventional PoP packaging approach, vertical interconnection of the stacked microelectronic devices is performed on a package level. That is, subsequent to singulation into individual die via wafer dicing, the semiconductor die are encapsulated to produce a number of discrete die packages. The discrete die packages (also referred to as "package layers" when included within a PoP package) are then stacked and vertically interconnected to produce the completed PoP package. Emerging PoP technologies include Wire Bond (WB) Ball Grid Array (BGA) PoP, FC PoP, Thru Mold Via (TMV) FC PoP, and Redistributed Chip Package (RCP) PoP packaging approaches.

BRIEF DESCRIPTION OF THE DRAWINGS

At least one example of the present invention will hereinafter be described in conjunction with the following figures, wherein like numerals denote like elements, and:

FIGS. 2-18 illustrate exemplary stacked microelectronic packages at various stages of manufacture and produced in accordance with the exemplary fabrication method shown in FIG. 1;

FIGS. 19-22 are simplified cross-sectional views illustrating several different types of stacked microelectronic packages, which can be produced utilizing the method illustrated in FIG. 1 in accordance with further exemplary embodiments of the present invention.

Figure 1:
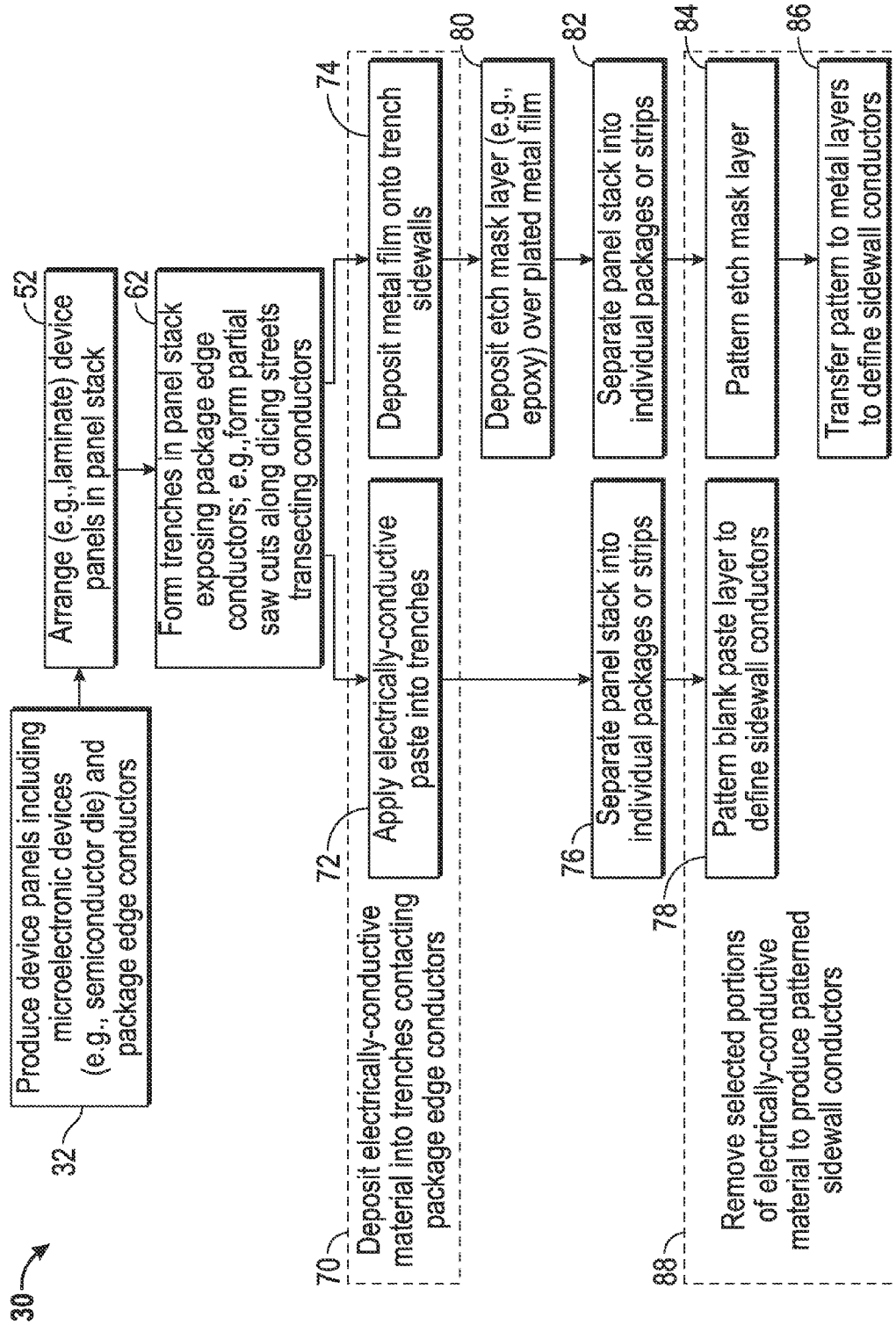
FIG. 1 is a flowchart illustrating a method for fabricating stacked microelectronic packages having patterned sidewall interconnects and performed on a panel or partial panel level, as illustrated in accordance with an exemplary and non-limiting embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

Terms such as "first," "second," "third," "fourth," and the like, if appearing in the description and the subsequent claims, may be utilized to distinguish between similar elements and are not necessarily used to indicate a particular sequential or chronological order. Such terms may thus be used interchangeably and that embodiments of the invention are capable of operation in sequences other than those illustrated or otherwise described herein. Furthermore, terms such as "comprise," "include," "have," and the like are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as appearing herein, is defined as directly or indirectly connected in an electrical or non-electrical manner. Furthermore, the terms "substantial" and "substantially" are utilized to indicate that a particular feature or condition is sufficient to accomplish a stated purpose in a practical manner and that minor imperfections or variations, if any, are not significant for the stated purpose.

As appearing herein, the term "microelectronic device" is utilized in a broad sense to refer to an electronic device, element, or component produced on a relatively small scale and amenable to packaging in the below-described manner. Microelectronic devices include, but are not limited to, integrated circuits formed on semiconductor die, microelectromechanical systems, passive electronic components, optical devices, and other small scale electronic devices capable of providing processing, memory, sensing, radiofrequency, optical, and actuator functionalities, to list but a few examples. Furthermore, the term "microelectronic package" is utilized herein to denote a structure or assembly including at least one and typically two or more microelectronic devices, which may or may not be electrically interconnected; and the term "stacked microelectronic package" is utilized to refer to a microelectronic package containing at least two microelectronic devices located within different levels or overlying layers of the microelectronic package. Finally, the term "stacked microelectronic devices" is utilized to collectively refer to two or more microelectronic devices, which are located on different levels of a stacked microelectronic package, as previously defined. The term "stacked microelectronic devices" thus does not require that one microelectronic device is necessarily positioned directly above or beneath another.

The following describes exemplary embodiments of a method for fabricating stacked microelectronic packages, which overcome the limitations associated with conventional PoP packaging approaches and other known packaging technologies of the type described above. In some, but not all, of the below-described embodiments, the fabrication method is performed through the processing of large scale, pre-singulated microelectronic device panels, which each contain a plurality of microelectronic devices embedded or encapsulated within a panel body. During processing, the device panels are laminated together or otherwise combined to produce panel stacks, which are later separated or singulated into a number of discrete package units each containing at least two packaged microelectronic devices. The microelectronic devices may be electrically interconnected by a number of package sidewall conductors or interconnects. Additionally or alternatively, the package sidewall conductors can be utilized to provide a convenient means of electrically coupling a microelectronic device contained within a lower package layer to contacts included within a contact formation formed over an upper package layer. In such embodiments wherein processing is performed on panel or partial panel level, the fabrication method improves efficiency, cost effectiveness, scalability, and overall productivity as compared to conventional packaging techniques wherein interconnection of stacked packages is carried-out on a die level or on a post-singulation package level. These benefits notwithstanding, embodiments of the fabricating method described herein can also be performed on a package level, as described more fully below in conjunction with FIGS. 23-38. Whether performed on a panel level, on a partial panel level, or on a package level, embodiments of the below-described fabrication method enable the production of highly compact microelectronic packages. Reductions in vertical package profile are achieved, at least in part, through the usage of uniquely-formed, patterned sidewall conductors, which eliminate or at least reduce the usage of BGAs or similar contact formations to interconnect the package layers. Additionally, the patterned sidewall conductors described herein also provide superior layer-to-layer interconnectivity between package layers, and specifically between the microelectronic devices containing within different package layers, as compared to BGAs and similar contact formations.

FIG. 1 is a flowchart setting-forth a method 30 for fabricating a number of stacked microelectronic packages each including two or more microelectronic devices interconnected by a plurality of patterned sidewall conductors. As shown in FIG. 1 and described in detail below, method 30 is offered by way of non-limiting example only. It is emphasized that the fabrication steps shown in FIG. 1 can be performed in alternative orders, that certain steps may be omitted, and that additional steps may be performed in alternative embodiments. Furthermore, various steps in the manufacture of microelectronic packages or certain components included within the microelectronic packages described below (e.g., microelectronic device panels produced using Redistributed Chip Packaging techniques) are well-known and, in the interests of brevity, will only be mentioned briefly herein or will be omitted entirely without providing the well-known process details. While described below in conjunction with the manufacture of two exemplary stacked packages, as illustrated at various stages of completion in FIGS. 2-18, it will be appreciated that exemplary method 30 can be utilized to produce various other types of stacked microelectronic packages including, but not limited, to those described below in conjunction with FIGS. 19-22.

Figure 2:
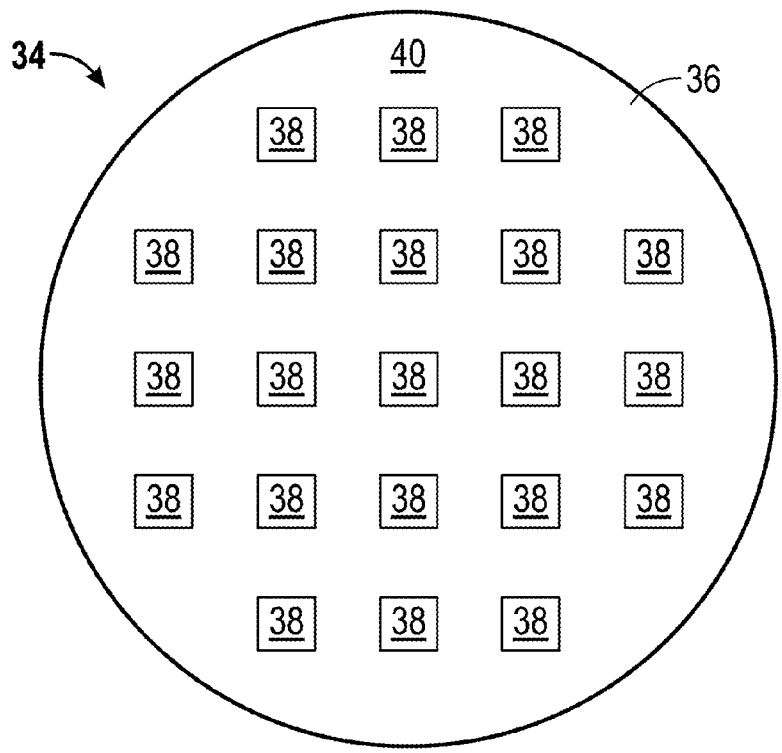

Exemplary method 30 commences with the production of a number of microelectronic device panels each containing an array of microelectronic devices (STEP 32, FIG. 1). FIG. 2 is a top-down view illustrating a partially-completed device panel 34, which may be produced during STEP 32 of method 30. It can be seen in FIG. 2 that exemplary device panel 34 includes a panel body 36 in which a plurality of microelectronic devices 38 are embedded. Devices 38 are exposed through major surface 40 of panel body 36 (referred to herein as "device surface 40") at this juncture in the fabrication process, but may subsequently be covered by one or more additional layers of material, as described below in conjunction with FIG. 3. In the illustrated example, device panel 34 includes twenty one square-shaped devices 38 arranged in a grid pattern or array; however, the number of microelectronic devices, the planform dimensions of the microelectronic devices (e.g., the die shape), and the manner in which the devices are spatially distributed within panel body 36 will inevitably vary amongst embodiments. Panel body 36 is conveniently produced as a relatively thin, disc-shaped body or mass having a generally circular planform geometry; however, panel body 36 can be fabricated to have any desired shape and dimensions. Panel body 36 is conveniently produced to have a thickness equivalent to or slightly exceeding the maximum height of microelectronic devices 38 (i.e., the die height when devices 38 are semiconductor die) to minimize the overall vertical profile of the completed stacked microelectronic package.

Device panel 34 can be produced utilizing a fan-out wafer level packaging approach, such as a Redistributed Chip Packaging (RCP) manufacturing process. By way of non-limiting example, one RCP process suitable for fabricating device panel 34 may be performed as follows. First, microelectronic devices 38 are distributed in a desired spatial arrangement over the surface of a support substrate or carrier; e.g., devices 38 may be arranged over the carrier in a grid array of the type shown in FIG. 2. If desired, one more release layers may also be applied or formed over the carrier's supper surface prior to positioning of the microelectronic devices. A mold frame, which has a central cavity or opening therethrough, is positioned over the carrier and around the array of microelectronic devices 38. An encapsulant, such as a silica-filled epoxy, is then dispensed into the cavity of the mold frame and flows over microelectronic devices 38. Sufficient volume of the encapsulant is typically dispensed over microelectronic devices 38 to enable the encapsulant to flow over the uppermost or non-contact-bearing surfaces of devices 38. The encapsulant may then be solidified by, for example, an oven cure to yield a solid panel body in which microelectronic devices 38 are embedded. The panel body may be rigid or flexible, depending upon the chosen encapsulant. The panel body is then released from the carrier to reveal the backside of the panel body through which devices 38 are exposed; i.e., device surface 40 in the exemplary embodiment shown in FIG. 2. If desired, the front side of panel body 36 may be ground or polished to bring device panel 34 to a desired thickness prior to release of the panel body from the carrier. The foregoing example notwithstanding, panel body 36 can be produced utilizing various other known fabrication techniques including, for example, compression molding and lamination processes.

After encapsulation of microelectronic devices 38 within panel body 36, a plurality of package edge conductors is next fabricated over device surface 40 of device panel 34. As utilized herein, the term "package edge conductor" refers to an electrically-conductive element, such as a metal trace, a wire, an interconnect line, a metal-filled trench, a bond pad, or the like, which is electrically coupled to a microelectronic device embedded within a package or package layer and which extends to a sidewall or edge portion of the package to contact a sidewall conductor, such as the sidewall conductors described below in conjunction with FIGS. 12, 18, and 28. The package edge conductors can assume a wide variety of different forms and, in certain embodiments, may comprise a number of electrically-conductive lines (e.g., metal traces), vias, metal plugs, and the like, which are formed in a number of dielectric layers (commonly referred to as a "build-up layers," "metal layers," or "redistribution layers" (RDLs)), and which collectively provide an electrically conductive path between an encapsulated microelectronic device and a package sidewall conductor formed over the package sidewall.

Figure 3:
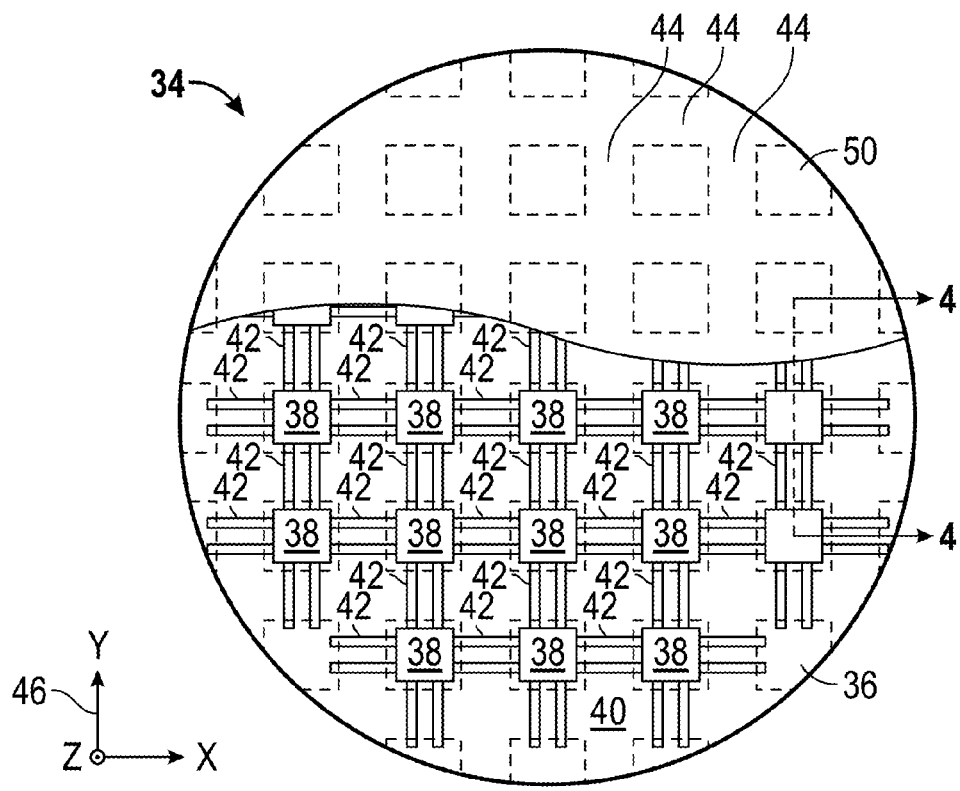
Figure 4:
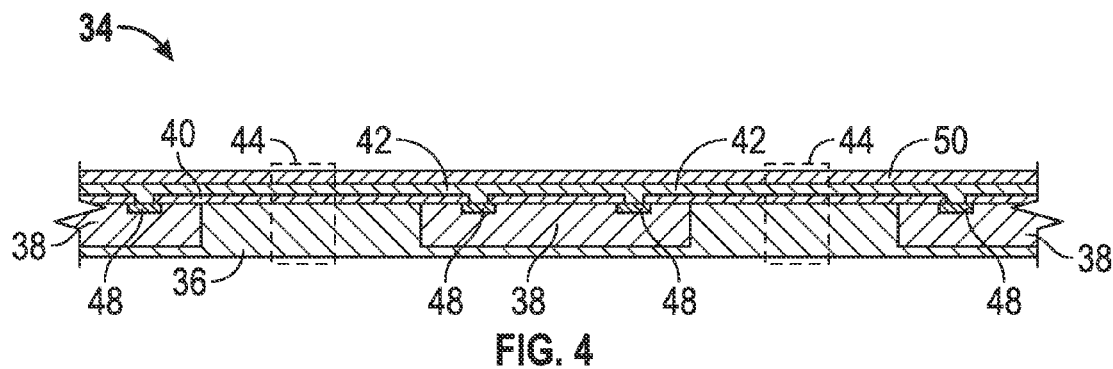

By way of non-limiting example, FIG. 3 illustrates a number of package edge conductors 42 that can be formed over device surface 40 of panel 34 during STEP 32 of method 30 (FIG. 1); and FIG. 4 is a cross-sectional view of a portion of microelectronic device panel 34, as taken along line 4-4 identified in FIG. 3. In this example, package edge conductors 42 assume the form of a number of interconnect lines or metal (e.g., copper) traces and will consequently be referred to as "traces 42" hereafter. In the exemplary embodiment shown in FIGS. 3 and 4, traces 42 extend along a plane parallel with device surface 40 or, stated differently, along the x-y plane identified in FIG. 3 by coordinate legend 46. Traces 42 are conveniently produced utilizing standard bumping or wafer level packaging fabrication techniques well-known within the semiconductor industry, such as sputtering or plating processes. As will be appreciated, traces 42 will typically be formed in one or more layers of dielectric material 50 (shown in FIG. 4 and not shown in FIG. 3 to more clearly illustrate the positioning of microelectronic devices 38 with respect to traces 42). As can be seen most readily in FIG. 4, package edge conductors 42 are electrically coupled to a number of landing pads or other electrical contact points 48 provided on each microelectronic device 38. Package edge conductors 42 may be electrically connected to device contact points 48 by filled vias, plated vias, metal plugs, or the like formed through the dielectric layer underlying package edge conductors 42 utilizing bumping, wafer level packaging, or other known processing techniques. After formation of package edge conductors 42, an overlying dielectric, capping, or passivation layer 50 (partially shown in FIG. 3 and fully shown in FIG. 4) may be formed over package edge conductors 42 utilizing a spin-on coating process, printing, lamination, or other deposition technique.

Package edge conductors 42 extend from their respective microelectronic devices 38 to neighboring dicing streets 44, which surround or border each device 38 and which are generically represented in FIG. 3 by intersecting dashed columns and rows. Dicing streets 44 represent portions of device panel 34 located between and around devices 38, which lack electrically-active elements and along which the stacked microelectronic packages are divided during singulation, as described below in conjunction with FIGS. 10 and 15. Dicing streets 44 are also commonly referred to as "saw streets"; however, the term "dicing streets" is used herein to emphasize that, while it is preferred that the singulation is accomplished through a mechanical sawing process, other dicing techniques can also be employed to separate the stacked microelectronic packages during the below-described singulation process including, for example, laser cutting and scribing with punching. As indicated in FIGS. 3 and 4, neighboring package edge conductors 42 that align on the same axis along which the neighboring conductors extend (i.e., the x- or y-axis identified in FIG. 3) are conveniently formed to connect or meet within dicing streets 44 and thereby form a continuous conductive line extending between neighboring microelectronic devices 38; however, this is by no means necessary as the portions of package edge conductors 42 extending into dicing streets 44 are ultimately removed during processing and, specifically, during the "half saw" or non-penetrating trench formation process described below in conjunction with STEP 62 of exemplary method 30 (FIG. 1).

Figure 5:
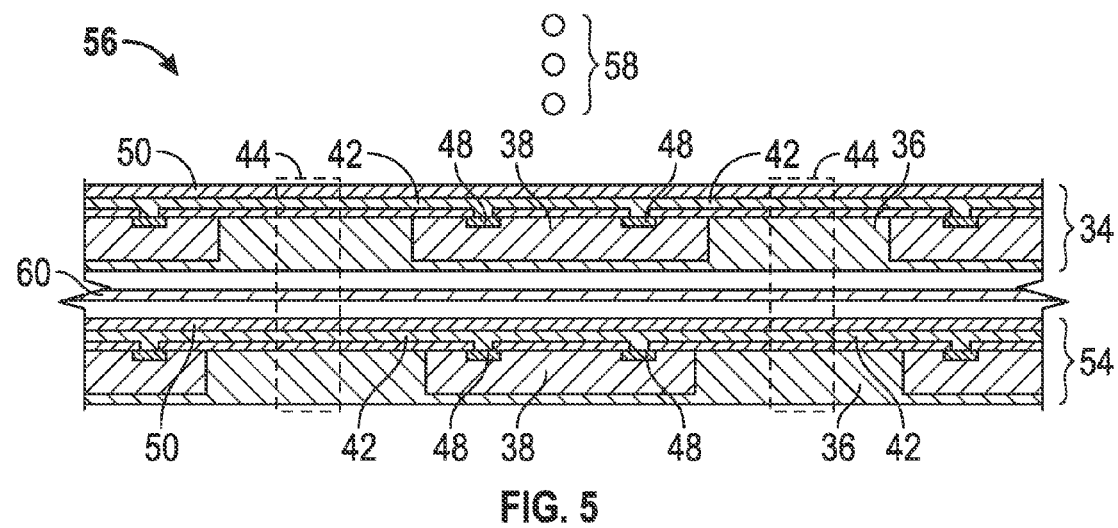
Figure 6:
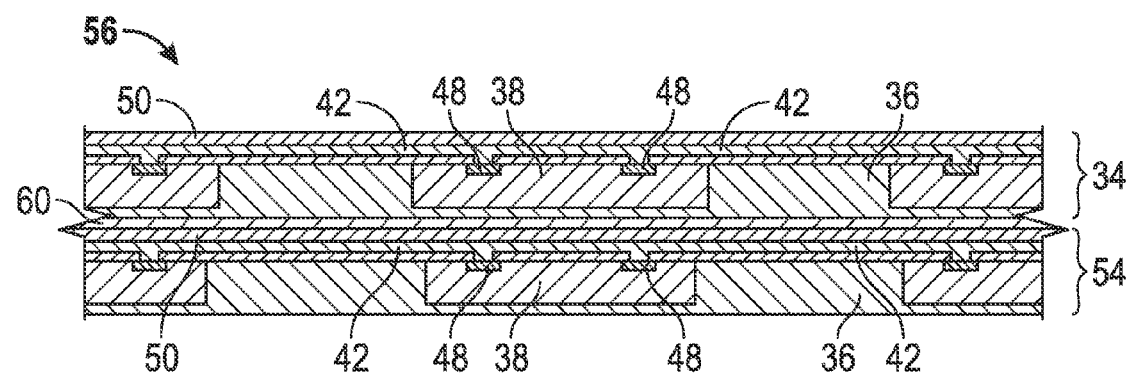

Continuing with exemplary fabrication method 30, the microelectronic device panels are next consolidated into a panel stack (STEP 52, FIG. 1). FIGS. 5 and 6 illustrate, in exploded cross-sectional and cross-sectional views, respectively, one manner in which device panel 34 may be positioned in a vertically overlapping relationship with an additional device panel 54 to produce an exemplary panel stack 56 (partially shown). For convenience of explanation, device panel 54 is illustrated and described below as being substantially identical to device panel 34; e.g., as does device panel 34, device panel 54 includes a panel body 36, a number of microelectronic devices 38 embedded in the panel body 36, and a plurality of package edge conductors 42 (e.g., metal traces) extending from devices 38 to dicing streets 44. It will be appreciated, however, that device panel 54, and the microelectronic device or devices contained therein, will typically differ from device panel 34 in structure and function. Furthermore, as indicated in FIG. 5 by ellipses 58, any practical number of additional device panels may also be included within panel stack 56. In view of the illustrated orientation of panel stack 56, device panel 34 will be referred to as "upper device panel 34" herein below, while device panel 54 is referred to as "lower device panel 54." It should be understood, however, that this terminology is used for convenience of reference only, that the orientation of the completed stacked microelectronic package may be largely arbitrary, and that the microelectronic package will often be inverted during later processing steps and/or when mounted to a PCB or other component included within a larger electronic system.

When panels 34 and 54 are properly positioned within panel stack 56, the dicing streets of device panels 34 and 54 overlap, as taken along the vertical or z-axis (identified by legend 46 in FIG. 3) or as taken through the thickness of the panel stack (indicated in FIG. 5 by enlarged dashed boxes 44). Panels 34 and 54, and any additional microelectronic device panels included in panel stack 56, are advantageously laminated together during the production of panel stack 56. In this regard, an intervening bonding layer 60 may be applied or otherwise disposed between microelectronic device panels 34 and 54 prior to panel stacking Bonding layer 60 can be an epoxy or other adhesive, which may be applied over the upper surface of lower device panel 54 and thermally cured after positioning of upper device panel 34. This example notwithstanding, any suitable bonding material or means can be utilized to bond panels 34 and 54 together including, for example, double-sided adhesive tape. By laminating microelectronic device panels 34 and 54 together in this manner, the relative positioning of panels 34 and 54 and, therefore, the relative positioning of the microelectronic devices 38 embedded within panels 34 and 54 can be maintained during processing and after singulation into discrete stacked microelectronic packages.

After consolidation of microelectronic device panels 34 and 54 into panel stack 56 in the above-described manner, a number of openings or trenches are next formed in microelectronic panel stack 56 at selected locations (STEP 62, FIG. 1). The trenches are formed through an upper surface of microelectronic panel stack 56 to transect package edge conductors 42 (FIGS. 5 and 6) included within device panels 34 and 54 and now embedded within panel stack 56. The trenches formed in microelectronic panel stack 56 expose package edge conductors 42 (FIGS. 5 and 6) through the upper surface of panel stack 56 to permit the deposition of an electrically-conductive material into the trenches and in contact with conductors 42. The conductive material deposited into the conductor-exposing trenches can subsequently be patterned to yield package sidewall conductors interconnecting the package layers, as described below in conjunction with PROCESS BLOCK 88 of exemplary method 30 (FIG. 1). The term "trench" is utilized herein to indicate that the openings formed in panel stack 56 will typically have an elongated, generally linear planform shape. This is, however, by no means necessary; and the term "trench," as appearing herein, is defined to include any opening formed in a microelectronic panel stack and exposing one or more package edge conductors, as previously defined.

Figure 7:
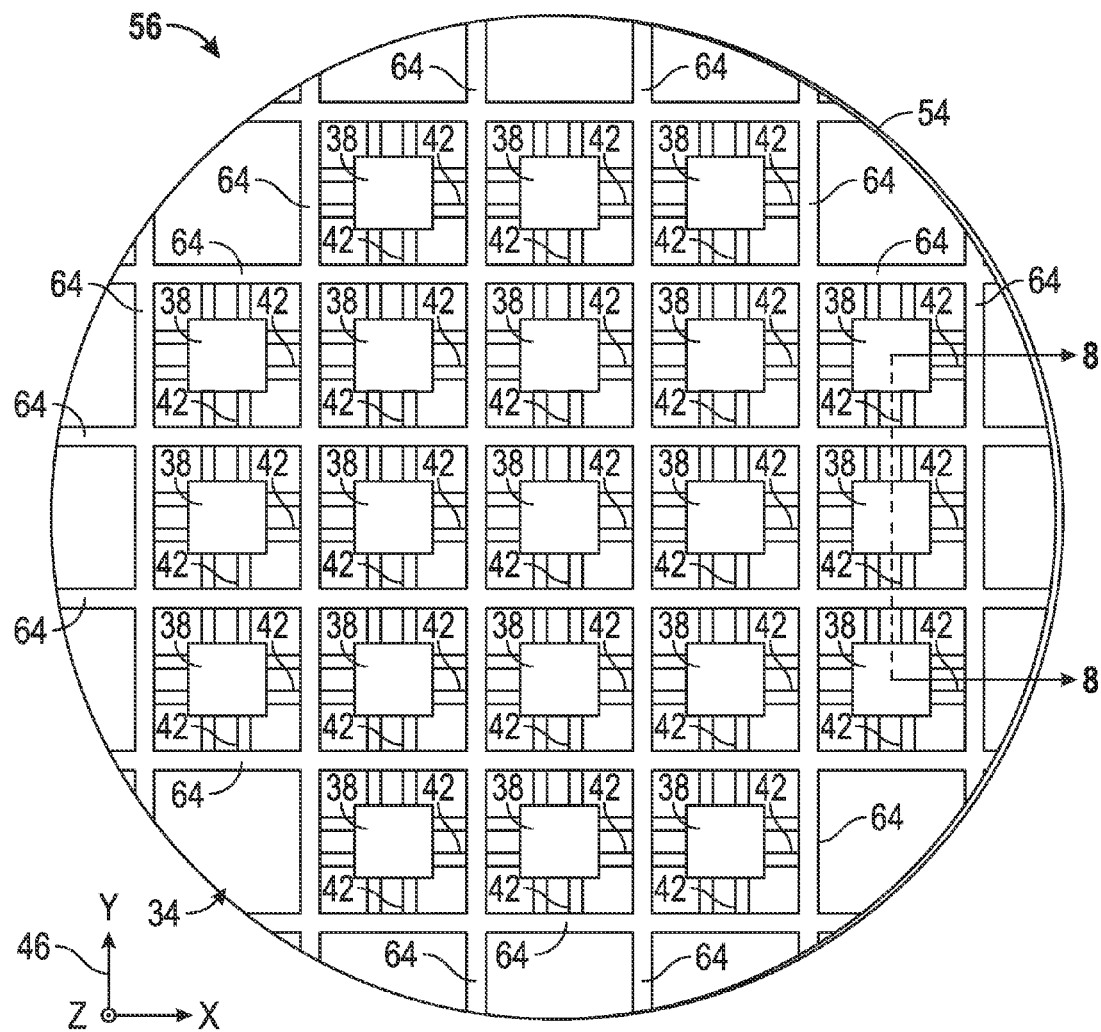
Figure 8:
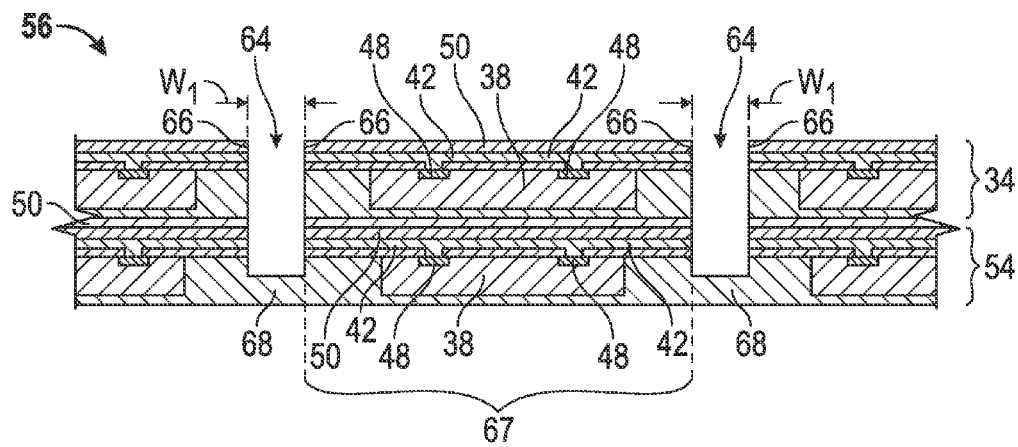

FIGS. 7 and 8 are top-down and cross-sectional views, respectively, of exemplary panel stack 56 after the formation of a plurality of trenches 64 in panel stack 56, as illustrated in accordance with an exemplary embodiment (STEP 62, method 30). As indicated above, trenches 64 are conveniently formed as non-penetrating vertical openings or elongated slots, which extend from the uppermost surface of device panel 34, entirely through the body of panel 34, and into, but not through, lower device panel 54. As a result, and as identified in FIG. 8, lower connecting portions 68 of lower device panel 54 are left intact immediately below trenches 64 preventing premature singulation of panel stack 56 and enabling continued performance of subsequent processing steps on a panel level for increased manufacturing efficiency. Trenches 64 define, in substantial part, vertical sidewalls 66 of the partially-completed stacked microelectronic packages 67 (only one of which is fully shown in FIG. 8). In a preferred embodiment, trenches 64 are formed as elongated slots or grooves that each extend along the length of a different dicing street 44 (FIGS. 3-5) such that, collectively, trenches 64 form an intersecting grid or lattice to allow vertical interconnection of the stacked microelectronic packages on four sides thereof. Trenches 64 can be readily formed utilizing a conventional dicing saw (e.g., a water-cooled diamond saw) having a predetermined blade width defining the trench width (identified as "$W_1$" in FIG. 8). Mechanical sawing can be performed in a highly efficient manner, especially in embodiments wherein trenches 64 are formed as a linear cuts extending entirely across the body of panel stack 56. However, while it is generally preferred that trenches 64 are produced utilizing mechanical sawing for reasons of simplicity and efficiency, trenches 64 can be formed utilizing other material-removal processes including, for example, laser ablation, routing, and mechanical drilling.

The illustrated example notwithstanding, trenches 64 need not extend entirely across the face of microelectronic panel stack 56 in all embodiments. Instead, in alternative embodiments, trenches 64 may be formed at discrete locations, whether by sawing or other material removal means, providing that trenches 64 intersect and expose package edge conductors 42 to enable interconnection of embedded microelectronic devices 38 in the manner described below. Furthermore, while conveniently formed to be vertically non-penetrating or blind, trenches 64 may be fully penetrating or partially penetrating in certain embodiments. For example, trenches 64 may be fully penetrating (that is, trenches 64 may extend entirely through lower device panel 54) in embodiments wherein lower device panel 54 is further releasably bonded to a support substrate and/or in embodiments wherein trenches 64 do not extend entirely across microelectronic panel stack 56. Moreover, in embodiments wherein vertical interconnection of the stacked microelectronic packages is required or desired only for one or two of the package sidewalls, a single series of generally parallel, non-intersecting trenches may be formed during STEP 62 of exemplary method 30 (FIG. 1). In still further embodiments, panel stack 56 may be cut into a number of elongated strips during STEP 62 (FIG. 1) and the below-described process steps may be performed using the elongated panel strips as opposed to whole device panels.

An electrically-conductive material is next deposited into trenches 64 such that the material contacts the terminal ends of package edge conductors 42 exposed through the vertical trench sidewalls (PROCESS BLOCK 70, FIG. 1). As indicated in FIG. 1, this is conveniently accomplished in one of two manners, namely, either by depositing an electrically-conductive paste into trenches 64 (STEP 72, FIG. 1) or, alternatively, by plating or otherwise depositing a metal film onto the trench sidewalls (STEP 74, FIG. 1). Exemplary method 30 may diverge at this point into one of two possible sub-processes depending upon the particular deposition process utilized and the particular type of material deposited into trenches 64 during PROCESS BLOCK 70 (FIG. 1). More specifically, and with reference to FIG. 1, either a first exemplary sub-process 72, 76, 78, which commences with the deposition of an electrically-conductive paste (or other flowable conductive material, as defined below) into trenches 64 (STEP 72, FIG. 1), may now be performed; or a second exemplary sub-process 74, 80, 82, 84, 86, which commences with the deposition of a metal film or layer over the trench sidewalls (STEP 74, FIG. 1), may now be performed. While represented as divergent paths in FIG. 1, these two exemplary sub-processes share certain similarities (e.g., singulation of the panel stack into individual packages or strips) and both ultimately produce stacked microelectronic packages having patterned sidewall conductors created via the removal of selected portions of the electrically-conductive material deposited into trenches 64, as indicated in FIG. 1 by PROCESS BLOCK 88. Exemplary sub-process 72, 76, 78 is described below in conjunction with FIGS. 9-12; and exemplary sub-process 74, 80, 82, 84, 86 is described below in conjunction with FIGS. 13-18.

Figure 9:
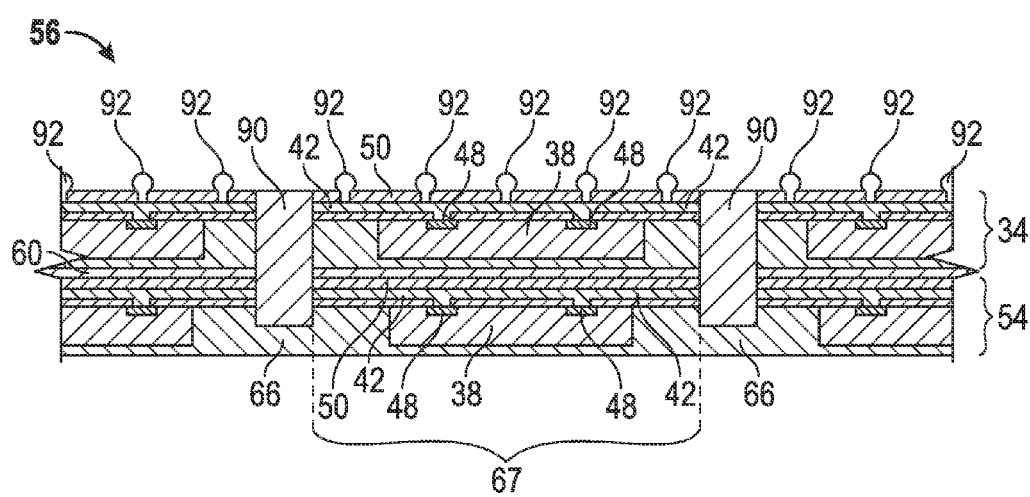

With continued reference to exemplary fabrication method 30 shown in FIG. 1, sub-process 72, 76, 78 commences the deposition of an electrically-conductive paste into trenches 64 (STEP 72, FIG. 1). As utilized herein, the term "paste" denotes a material that is sufficiently flowable under process conditions to permit inflow into and at least partial filling of trenches 64. For convenience of reference, and without necessary indicating that each trench is filled with paste in its entirety during STEP 72, this process is referred to herein as a "trench fill process." A non-exhaustive list of materials suitable for usage during the above-described trench filling process includes nanoparticle-filled inks, electrically-conductive polymers, solder pastes, solder-filled adhesives and metal-containing adhesives or epoxies, such as silver-, nickel-, and copper-filled epoxies, all of which are considered "electrically-conductive pastes" in the context of this document. While it is preferred that an electrically-conductive paste is dispensed or otherwise deposited into trenches 64 during STEP 72, other types of flowable conductive materials can also be employed including low melt point metals and alloys, which do not include resins or fluxes and which have melt points less than about 300° C. Such material include, but are not limited to, indium and bismuth. The term "electrically-conductive paste" and the more general term "flowable conductive material" both expressly exclude metals and alloys, such as copper and tungsten, deposited using PVD, CVD, or a similar atomic-level deposition process. Whether the sidewall conductors are fabricated from a flowable conductive material, as defined above, or from a plated metal film results in a structural difference in the microstructure of the sidewall conductors (e.g., whether the microstructure is columnar), which can be observed utilizing a scanning electron microscope or similar inspection tool. Different application techniques can be employed to direct the electrically-conductive paste into conductor-exposing trenches 64 (FIGS. 7 and 8) including, but not limited to, stencil or screen printing, squeegee application, needle depositing, jetting, and the like. In one embodiment, the conductive paste is a silver-filled epoxy dispensed into trenches 64 in sufficient quantity to substantially fill each trench 64 utilizing a screen printing technique. The deposition of electrically-conductive material into trenches 64 is ideally controlled such that little to no conductive material is deposited over the upper surface of panel stack 56. An example of the structure that may result from STEP 72 (FIG. 1) is shown in FIG. 9 wherein conductor-exposing trenches 64 have been filled with an electrically-conductive paste to yield filled trenches 90.

After deposition of the electrically-conductive material into conductor-exposing trenches 64, a thermal cure may be performed, if needed. If performed, the parameters of the thermal cure will vary depending upon the deposited volume and the particular composition of electrically-conductive material 90 deposited into trenches 64; however, to provide a generalized example in an embodiment wherein a metal-filled epoxy is utilized, an oven cure may be performed at a temperature of about 160° C. to about 300° C. for approximately one hour. As further indicated in FIG. 9, a solder BGA including a plurality of solder balls 92 may be formed over the uppermost surface of upper device panel 34 prior to or subsequent deposition of electrically-conductive material 90 into the conductor-exposing trenches. The BGA may be formed utilizing well-known bumping process techniques, such as photolithographical patterning of the uppermost dielectric or passivation layer 50 and subsequent deposition of solder balls 92. In further embodiments, BGA formation may be performed at a different juncture in the fabrication process and/or different contact formations may be employed.

Figure 10:
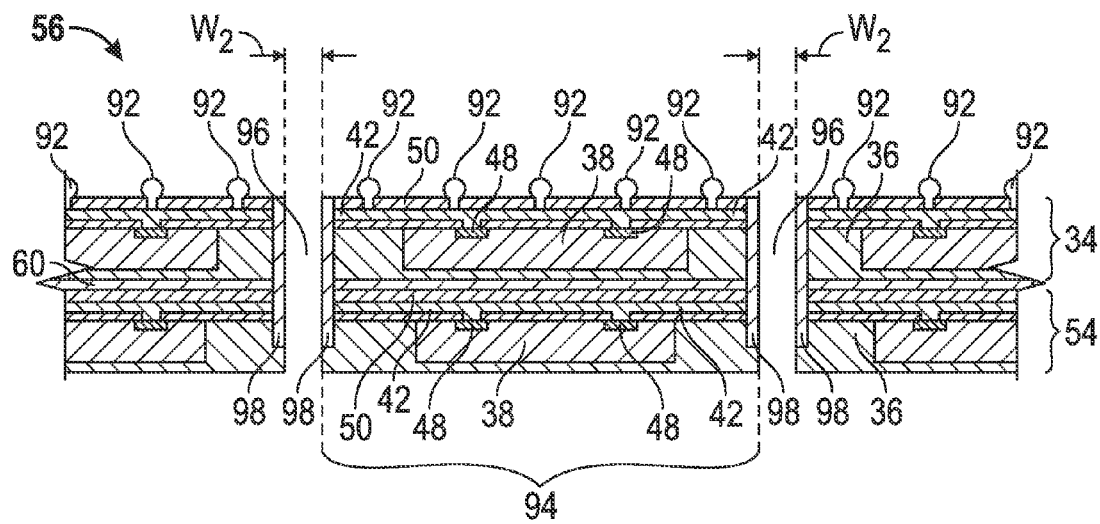

Next, at STEP 76 of exemplary method 30 (FIG. 1), the panel stack is separated or singulated into a number of partially-completed stacked microelectronic packages or strips. FIG. 10 is a cross-sectional view of a portion of exemplary panel stack 56 after singulation to yield a plurality of stacked microelectronic packages 94. Singulation may be carried-out utilizing different separation processes including laser cutting, mechanical sawing, and scribing with punching. If laser cutting, mechanical sawing, or another material removal process is employed, the cuts 96 created by such a process are preferably formed to have a predetermined uniform width (identified in FIG. 10 as "$W_2$"), which is less than the predetermined uniform trench width (again, identified in FIG. 8 as "$W_1$"). In one embodiment wherein trenches 64 (FIGS. 7 and 8) are formed utilized a first dicing saw having a first blade thickness equivalent to the desired trench width ($W_1$), singulation of panel stack 56 is carried-out by dicing using a second a dicing saw having a predetermined blade thickness equivalent to the desired cut width ($W_2$) and less than the first predetermined blade thickness ($W_1$). The illustrated example notwithstanding, full singulation of panel stack 56 into a plurality of discrete packages need not be performed in all embodiments; instead, as indicated in FIG. 1, panel stack 56 may be singulated into a number of strips each including multiple connected packages 94 during STEP 76 in embodiments wherein only one or two sides of packages need be patterned to produce the sidewall conductors described below. In this case, the strips may further be divided into discrete stacked microelectronic packages utilizing a second singulation process after patterning of the sidewall conductors.

Figure 11:
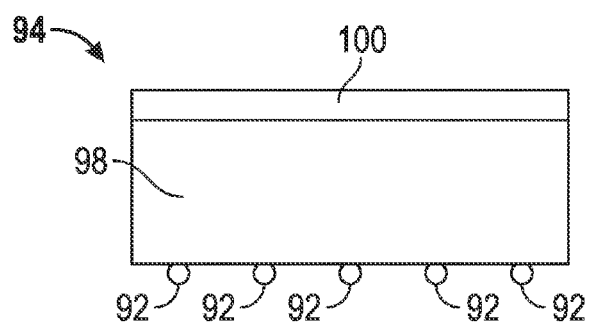

FIG. 11 is a non-cross-sectional side view of partially-completed stacked microelectronic package 94 produced pursuant to singulation of panel stack 56. As can be seen in FIG. 11, microelectronic package 94 includes an unpatterned or blank layer of electrically-conductive paste 98, which overlays the vertical package sidewalls and which contacts the exposed terminals ends of package edge conductors (hidden from view in FIG. 11 and shown in FIGS. 3-10). In the illustrated example wherein microelectronic panel stack 56 is fully singulated into a plurality of stacked microelectronic packages 94, unpatterned paste layer 98 extends around all four sides of each stacked microelectronic package 94. In alternative embodiments wherein panel stack 56 is separated into a number of strips, the blank electrically-conductive paste layer 98 may be formed over only one or two sides of the partially-completed microelectronic packages. The thickness of electrically-conductive, unpatterned paste layer 98 will generally be equivalent to one half the difference between the trench width (identified as "$W_1$" in FIG. 8) and the singulation cut width (identified in FIG. 10 as "$W_2$").

Figure 12:
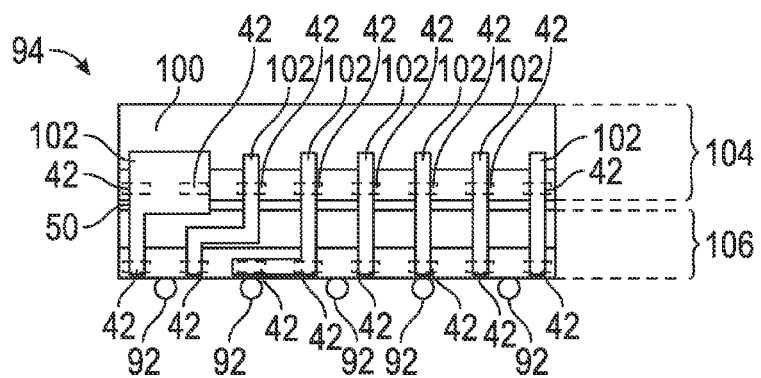
Figure 13:
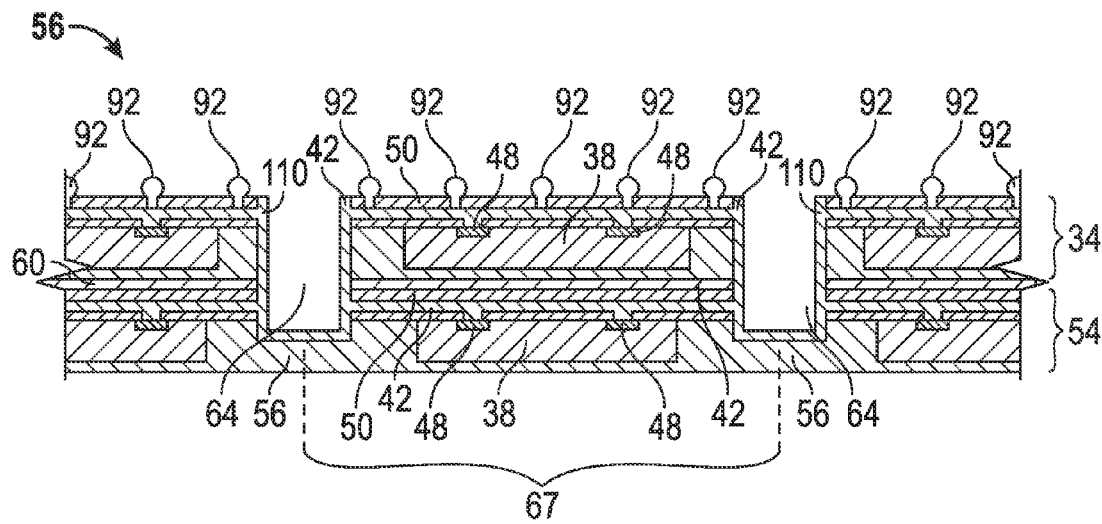

Next, during STEP 78 of exemplary method 30 (FIG. 1), unpatterned paste layer 98 overlying the vertical package sidewalls is patterned. With reference to FIG. 12, selected portions of unpatterned paste layer 98 are removed to yield a plurality of patterned sidewall conductors 102 interconnecting different groups of package edge conductors 42 exposed through the vertical package sidewall of stacked microelectronic package 94. Patterning of paste layer 98 is preferably accomplished using laser ablation using, for example, a UV or $CO_2$ laser drilling machine. Advantageously, in embodiments wherein blank layer 98 is composed of an electrically-conductive paste, the laser ablation process can be carried-out at significantly lower energies than typically required to remove metal film deposited utilizing chemical vapor deposition (CVD), physical vapor deposition (PVD), or a similar deposition technique. For example, and with the understanding that the requisite laser energy will inevitably vary between different embodiments, electrically-conductive pastes and epoxies of the type described herein can often be removed at laser energy levels below about 3 Watts, while energy levels of at least about 6 Watts and commonly exceeding about 8 Watts are typically required to remove deposited metal films. Thus, in embodiments wherein laser ablation is utilized to remove selected portions of the electrically-conductive material deposited into the trenches, the maximum energy level is preferably less than about 4 Watts and, more preferably, less than about 3 Watts. By employing such a low energy laser ablation process to pattern layer 98, undesired heating of the surrounding portions of stacked microelectronic package 94 can be avoided, which could otherwise damage or structurally degrade package 94 by accelerating delamination and separation of the package layers.

With the completion of STEP 78 (FIG. 1), a number of stacked microelectronic packages has now been formed. With reference to the exemplary embodiment illustrated in FIG. 12, each stacked microelectronic package 94 includes two package layers 104 and 106, which are singulated portions of device panels 34 and 54 (FIGS. 5-10), respectively, and which each contains at least one embedded microelectronic device. Each package layer 104, 106 also includes a number of package edge conductors 42 (physically covered in FIG. 12 and thus illustrated in phantom) extending to the illustrated vertical package sidewall to contact different ones of package edge conductors 42. In this manner, package edge conductors 42 may interconnect the microelectronic devices embedded within package layers 104 and 106. Stacked microelectronic package 94 may differ structurally from certain known stacked microelectronic packages in at least several respects. First, sidewall conductors 102 are composed or comprised of an electrically-conductive paste or other flowable conductive material of the type described above. Second, patterned sidewall conductors 102 are formed directly over and intimately contact the package sidewalls and are not separated therefrom by, for example, a seed layer of the type commonly utilized in conjunction with plating processes. Third, as noted above, package layer 104 includes a circumferential ledge or shelf 100, which is created by the trench formation or "half saw" process described above in conjunction with STEP 52 of exemplary method 30 (FIG. 1) and which extends around the perimeter of package 94. Sidewall conductors 102 extend from an edge of package 94 (i.e., the lower edge in the illustrated orientation shown in FIG. 12) to ledge 100 and are substantially flush therewith.

The foregoing has thus described an embodiment of exemplary method 30 (FIG. 1) concluding with first sub-process 72, 76, 78 during which an electrically-conductive paste was dispensed or otherwise applied into trenches 64 (FIGS. 7 and 8). However, as briefly described above and as indicated in FIG. 1 by STEP 74 in PROCESS BLOCK 70, a metal film may instead be deposited over the vertical sidewalls of trenches 64 in an alternative embodiment of method 30 (FIG. 1) concluding with a second sub-process 74, 80, 82, 84, 86. This may be more fully appreciated by referring to FIG. 13, which illustrates microelectronic panel stack 56 after the formation of a metal film 110 over the interior of conductor-exposing trenches 54. Metal film 110 can be formed from any electrically-conductive metal, such as copper or gold, deposited utilizing PVD, CVD, or other suitable metallization process. Metal film 110 is ultimately patterned to define sidewall conductors interconnecting the package layers during STEPS 84 and 86 of exemplary method 30 (FIG. 1); consequently, metal film 110 may be referred to as "blank metal film 110" or "unpatterned metal film 110" hereafter. Although illustrated as a single layer in FIG. 13, multiple metal layers may be deposited over the trench sidewalls during STEP 74 in further embodiments of method 30. For example, a first metal film or layer may be deposited utilizing a metal that adheres well to the trench sidewalls, such as tungsten; and then a second metal film of, for example, copper may be deposited over the first metal film for increased conductivity. As further indicated in FIG. 13, a BGA including a number of solder balls 92 may be formed after deposition of metal film 110 or at any other suitable juncture in the fabrication process.

Figure 14:
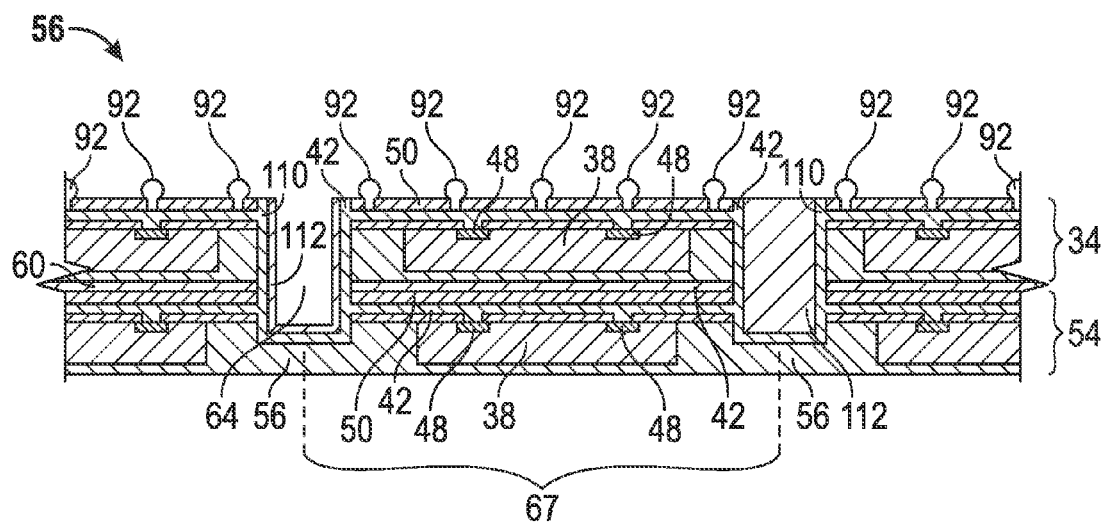

Advancing to STEP 80 of exemplary method 30 (FIG. 1), an etch mask layer 112 is next deposited into plated trenches 54 and over unpatterned metal film 110. FIG. 14 illustrates microelectronic panel stack 56 after deposition of such an etch mask layer 112. As indicated on the left side of FIG. 14, etch mask layer 112 can be applied as a relatively thin layer, which is conformally deposited over blank metal film 110 utilizing, for example, a spray process. Alternatively, and as indicated on the right side of FIG. 14, etch mask layer 112 can be applied in bulk in a flowable state to fill the plated trenches and to yield filled trenches (only one of which is shown in FIG. 14). An organic planarization material is conveniently employed to form etch mask layer 112 when deposited as a conformal layer; while, in embodiments wherein etch mask layer 112 is deposited into and substantially fills trenches 64, a non-conductive, non-photo-imageable paste may be used.

After deposition of the etch mask layer over the plated trench (STEP 80, FIG. 1), microelectronic panel stack 56 is singulated into partially-completed stacked microelectronic packages or strips (STEP 82, FIG. 1). The singulation process performed during STEP 82 is essentially the same as the singulation process described above in conjunction with STEP 76 of exemplary method 30 (FIG. 1) and will thus not be described in detail again. However, it is noted that singulation is conveniently, although not necessarily, carried-out utilizing a dicing saw having a blade thickness less than the trench width (identified in FIG. 8 as "$W_1$"). Furthermore, as previously noted, microelectronic panel stack 56 may be cut or otherwise separated into a number of strips in certain embodiments such that full singulation of panel stack 56 is not completed until after the below-described sidewall conductor patterning process. FIG. 15 illustrates microelectronic panel stack 56 in cross-section after singulation into a plurality of partially-completed stacked microelectronic packages 116 (only one of which is fully shown) via removed or cut saw streets 96, and FIG. 16 illustrates in a non-cross-sectional side view one stacked microelectronic package 116 produced pursuant to singulation of panel stack 56.

Next, selected portions of unpatterned metal film 110 plated or otherwise deposited onto the trench sidewalls are removed to define a plurality of sidewall conductors interconnecting the package layers. Patterning of metal film 110 may be performed as follows. First, at STEP 84 (FIG. 1), etch mask layer 112 is patterned using, for example, a laser ablation process of the type described above. An example of the manner in which one microelectronic package 116 may appear after patterning of etch mask layer is shown in FIG. 17 wherein the patterned etch mask layer is identified by reference numeral 118. As can be seen, this leaves selected portions of unpatterned metal film 110 exposed through the openings created in etch mask layer 112. After patterning of etch mask layer 118, the pattern is transferred to metal film 110 utilizing an etching process (STEP 86, FIG. 1). In one embodiment, a wet etch is performed having a chemistry selective to the parent material of metal film 110 over the material of etch mask layer 118. Notably, such a wet etch can be carried-out in a highly efficient and cost effective manner by soaking in a chemical bath, although the possibility that a dry etch (e.g., a reactive ion etch) can be performed during STEP 86 is by no means precluded. Whether a wet or dry etch is performed to transfer the pattern from etch mask layer 118 to metal film 110, such an etching process will typically be more efficient than photolithographical processes, which tend to require multiple process steps and precise mask alignment. The resulting stacked microelectronic package 116 is shown in FIG. 18 wherein the plurality of patterned sidewall conductors are hidden from view by patterned etch mask layer 118. Microelectronic package 116 shown in FIG. 18 differs stacked microelectronic package 94 described above in conjunction with FIG. 12 in at least two primary manners, namely, the presence of patterned etch mask layer 118 covering the patterned sidewall conductors and the composition of patterned sidewall conductors, which are fabricated from a deposited metal film as opposed to an electrically-conductive paste as was previously the case. With these exceptions, microelectronic package 116 (FIG. 18) is substantially identical microelectronic package 94 (FIG. 12) and likewise includes overlaying package layers 104, 106 having package edge conductors 42 (illustrated in phantom) interconnected by way of the patterned sidewall conductors formed over the vertical package sidewalls to yield a highly compact and highly dense 3D microelectronic package.

In certain embodiments of the above-described fabrication method, a dielectric material may further be deposited over the vertical package sidewalls and in contact with the sidewall conductors formed thereover. In this case, the dielectric material is preferably occupies the area between the neighboring sidewall conductors. Various different dielectric materials suitable for this purpose are known; and various ones of the application techniques described above with the application of the flowable conductive material can be employed to deposit the dielectric including, for example, needle dispensing, or screen-printing techniques. The deposition of such an dielectric material prevents or minimize dendritic growth that may otherwise occur due to surface migration of certain constituents (e.g., silver particles) included within the flowable conductive material from which the sidewall conductors are formed. In addition, the addition of such a dielectric material between the sidewall conductors may provide additional mechanical robustness and may be chosen to have better adhesive properties than the electrically-conductive material from which the sidewall conductors are formed.

The foregoing has thus provided embodiments of a method for fabricating a plurality of stacked microelectronic packages including a number of sidewall conductors or interconnects formed over the package sidewall. As embodiments of the above-described fabrication method are performed on a panel or partial panel level, significant improvements in manufacturing efficiency, cost effectiveness, scalability, and productivity can be realized. Embodiments of the above-described fabrication method also eliminate or reduce the need for vertical connection between package layers utilizing BGAs or similar contact formations thereby enabling a more compact vertical device profile and decreasing manufacturing complexity. Furthermore, embodiments of the fabrication method described above employ uniquely-formed sidewall connectors to interconnect package layers, which provide superior layer-to-layer interconnectivity as compared to BGAs or similar contact formations.

While described above in conjunction with a particular stacked microelectronic package type, it is emphasized that embodiments of exemplary method 30 (FIG. 1) can be employed to fabricate various different types of stacked microelectronic package wherein at least two microelectronic devices are located on different levels or within different package layers and interconnected by way of electrically-isolated sidewall conductors of the type described above. Further emphasizing this point, FIGS. 19-22 are simplified cross-sectional views illustrating different types of stacked microelectronic packages, which can be produced utilizing method 30 illustrated in FIG. 1 in accordance with still further exemplary embodiments of the present invention. Using like reference numerals to designate like structural elements, FIGS. 19-22 each illustrate a relatively simple stacked microelectronic package 140 including a first package or package layer 142 and a second package or package layer 144. As was the case previously, package layers 142 and 144 are laminated by an intervening bonding layer 146, such as adhesive tape or bonding material. Package layers 142 and 144 each include at least one microelectronic device 148 and 150, respectively, which is embedded within the package body 152. Package layers 142 and 144 further include package edge conductors 154 and 156, respectively, which extend to and are exposed through vertical package sidewalls 158. Sidewall conductors 160 are formed over vertical package sidewalls 158 and electrically interconnect the exposed terminal ends of package edge conductors 154 and 156 and, therefore, stacked microelectronic devices 148 and 150. As further shown in FIGS. 19-21 a plurality of solder balls 162 included within a BGA array may also be formed over the device surface of package layer 144 to facilitate electrical connection to printed circuit board or other component included within a larger electronic system.

As noted above, stacked microelectronic packages 140 are produced utilizing different paging approaches than was stacked microelectronic package 94 described above in conjunction with FIGS. 10-12 and stacked microelectronic package 116 described above in conjunction with FIGS. 16-18. For example, in the case of package 140 shown in FIG. 19, package layers 142 and 144 are produced utilizing Wafer-Level Chip-Scale Packaging (WL-CSP) and RCP packaging processes, respectively. In the exemplary embodiment illustrated in FIG. 20, package layers 142 and 144 are each produced utilizing a Molded Array Process Ball Grid Array (MAPBGA) process. In the exemplary embodiment illustrated in FIG. 21, package layers 142 and 144 are produced utilizing a hybrid Flip-Chip Ball Grid Array (FCBGA) and MAPBGA processes, respectively. Finally, in the exemplary embodiment illustrated in FIG. 22, package layers 142 and 144 are each produced utilizing a sawn Quad-Flat No-Lead (QFN) strip level stacking process. The package edge conductors can be formed in a single metal layer, as in the case of conductors 154 shown in FIG. 19; as a combination of conductive lines, vias, and the like formed in multiple dielectric or build-up layers, as in the case of conductors 156 shown in FIG. 19, conductors 154 and 156 shown in FIG. 20, and conductors 154 and 156 shown in FIG. 21; as wire bonds electrically coupled to conductive lines, as in the case of conductors 154 and 156 shown in FIG. 20 and conductors 156 shown in FIG. 21; or as wire bonds electrically coupled to bond pads exposed through the package sidewall, as in the case of conductors 154 and 156 shown in FIG. 22.

Figure 23:
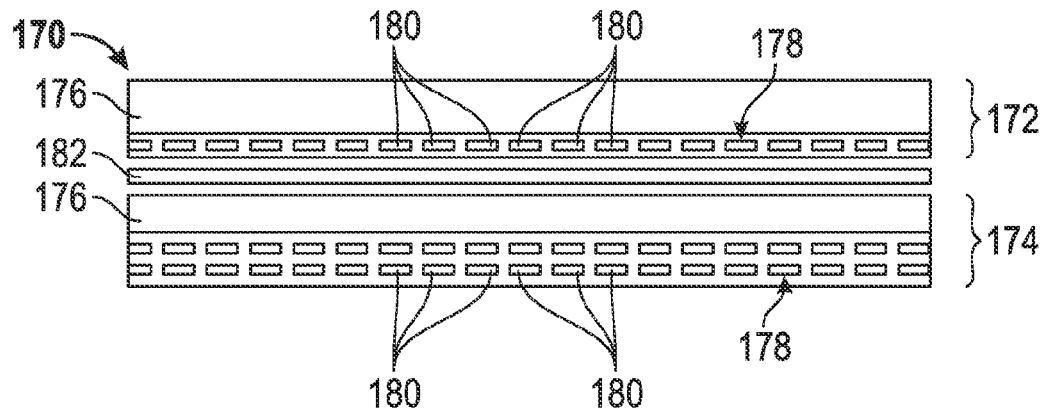
FIGS. 23-28 are simplified cross-sectional views illustrating, at various stages of completion, a stacked microelectronic package having patterned sidewall interconnects and produced in accordance with an exemplary embodiment of the fabrication method performed on a package level.
Figure 24:
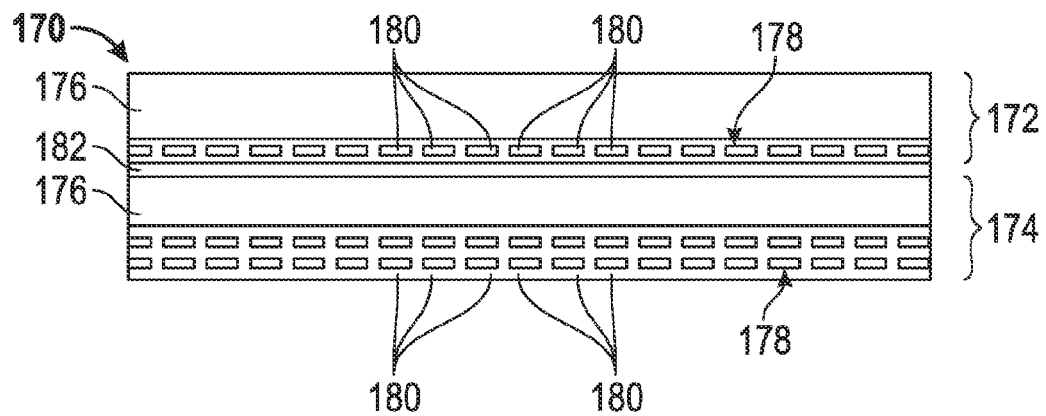

While the above-described fabrication method was performed through the processing of large scale, pre-singulated microelectronic device panel, further embodiments of the fabricating method described herein can also be performed on a package level. This may be more fully appreciated by referring to FIGS. 23-28 illustrating, at various stages of completion, a stacked microelectronic package 170 produced in accordance with a further exemplary embodiment of the present invention. Referring initially to FIG. 23, stacked microelectronic package 170 is shown immediately prior to consolidation of two package layers 172 and 174 into the stacked microelectronic package. Package layers 172 and 174 may each be formed utilizing an RCP technique of the type described above to impart each package layer 172, 174 with a molded package body 176 in which at least one microelectronic device is embedded and over which electrical interconnection elements 178 are formed or preformed through build-up layers, laminated substrate, leadframe, or other suitable production techniques. As further shown in FIG. 23, each package layer 172, 174 further includes a plurality of package edge conductors 180, the terminal ends of which are exposed through the vertical package sidewall. Package layers 172 and 174 are laminated together using a suitable adhesive or bonding layer 182 to yield the structure shown in FIG. 24.

Figure 25:
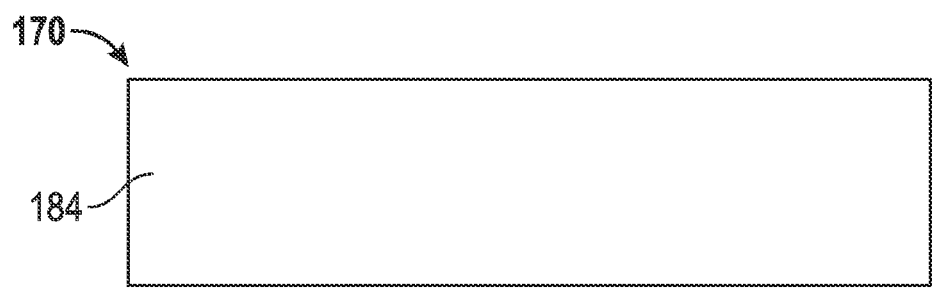
Figure 26:
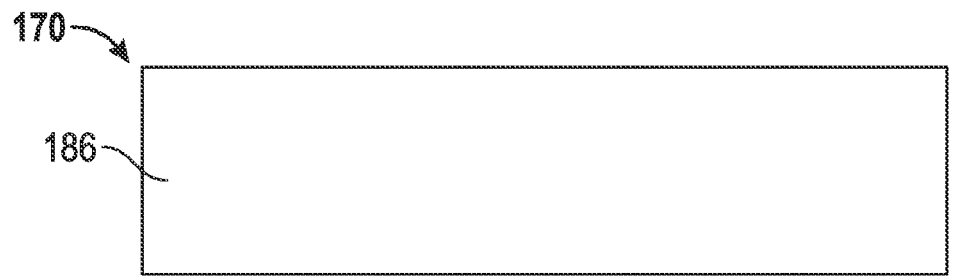
Figure 27:
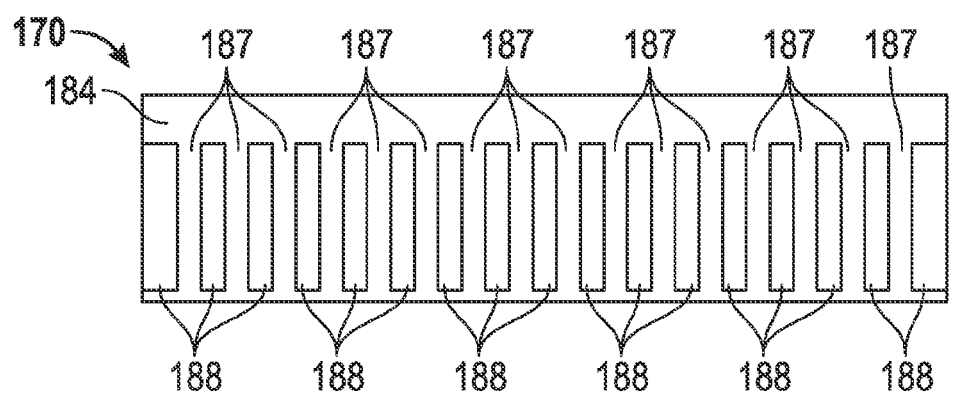
Figure 28:
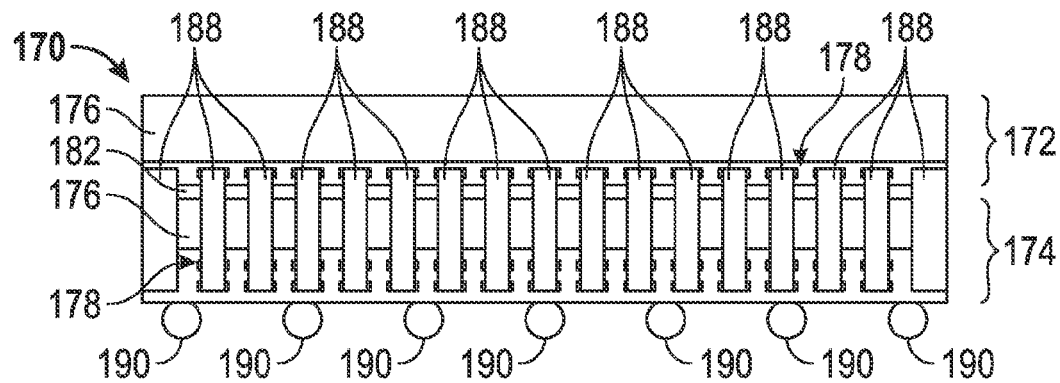

After bonding of package layers 172 and 174, patterned package edge conductors are formed over the vertical package sidewalls to interconnect package edge conductors 180 and, therefore, the microelectronic devices contained within the respective molded bodies 176 of the package layers. This may be accomplished utilizing essentially the same process as described above in conjunction with FIGS. 13-18. For example, as indicated in FIG. 25, a metal film 184 may first be deposited over the vertical package sidewalls using, for example, a PVD or CVD process. Subsequently, an etch mask layer 186 (shown in FIG. 26) may be deposited over metal film 184 utilizing, for example, a spray process. Etch mask layer 186 may then be patterned to produce a series of openings 187 therethrough, as shown in FIG. 27. The pattern may then be transferred to the metal film 184 using an etching process of the type described to yield stacked microelectronic package 170 shown in FIG. 28. As can be seen in exemplary embodiment illustrated in FIG. 28, stacked microelectronic package 170 includes patterned sidewall conductors, which underlie the remaining etch mask portions 188 and which electrically couple different sidewall conductors included within package layers 172 and 174 to electrically interconnect the microelectronic devices contained therein. Conventional processing steps (e.g., attachment of solder balls 190) may then be carried-out to complete fabrication of stacked microelectronic package 170.

It should thus be appreciated that there has been provided multiple exemplary embodiments of a method for fabricating stacked microelectronic packages, which provides excellent level-to-level interconnectivity through multiple package stacking, as well as package miniaturization and ultra high density package. In certain embodiments of the above-described method, device panels are produced to contain multiple semiconductor die (or other microelectronic devices), as well as package sidewall conductors (e.g., metal traces) connecting die pads to the saw scribes or dicing streets of the panel. Two or more panels are then laminated together with appropriate alignment and bonding material. A partial saw is applied to cut the panels to the bottommost panel and expose the package sidewall conductors. An electrically-conductive material, such as a metal-containing paste, is then applied to fill the grooves formed by partial saw. Laser ablation is then performed from top or device side of the panel stack to remove excess material in between the sidewall traces. Finally, the laminated panels are singulated into single units.

The foregoing has provided embodiments of a method for fabricating stacked microelectronic packages. In one embodiment, the method includes producing microelectronic device panels each comprising a plurality of microelectronic devices and a plurality of package edge conductors extending therefrom. The microelectronic device panels are arranged in a panel stack, and trenches are created in the panel stack exposing the plurality of package edge conductors. An electrically-conductive material is deposited into the trenches and contacts the plurality of package edge conductors exposed therethrough. The panel stack is then separated into partially-completed stacked microelectronic packages, either by fully separating the partially-completed stacked microelectronic packages into a number of discrete packages or by partially separating the stacked microelectronic packages into a number of strips. For at least one of the partially-completed stacked microelectronic packages, selected portions of the electrically-conductive material are removed to define a plurality of patterned sidewall conductors interconnecting the microelectronic devices included within the stacked microelectronic package.

In another embodiment, a method for fabricating stacked microelectronic packages includes obtaining, whether by independent fabrication or by purchase from a supplier, a partially-completed stacked microelectronic package having at least upper and lower package layers. The upper and lower package layers each include a package body, an electronic device embedded in the package body, and a plurality of package edge conductors extending from the electronic device to a sidewall of the package body. The plurality of package edge conductors are exposed through the sidewall of the package body. An unpatterned electrically-conductive layer is deposited over the package sidewall and contacts the exposed terminal ends of the plurality of package edge conductors. The unpatterned electrically-conductive layer is patterned to remove selected portions of the electrically-conductive layer and yield a plurality of sidewall conductors interconnecting the microelectronic devices included within the upper and lower package layers.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A method for fabricating stacked microelectronic packages, comprising:

arranging microelectronic device panels in a panel stack, each microelectronic device panel comprising a plurality of microelectronic devices and a plurality of package edge conductors extending therefrom;

forming trenches in the panel stack, the trenches having sidewalls through which the plurality of package edge conductors are exposed;

dispensing a metal-containing epoxy into the trenches in sufficient quantity to substantially fill the trenches and yield a plurality of epoxy-filled trenches separating the panel stack into partially-completed stacked microelectronic packages to produce unpatterned metal-containing epoxy layers contacting the plurality of package edge conductors, the panel stack separated along saw lanes extending through the epoxy-filled trenches to impart the unpatterned metal-containing epoxy layers with exposed sidewall surfaces; and patterning the unpatterned metal-containing epoxy layers to define a plurality of patterned sidewall conductors interconnecting the microelectronic devices included within the stacked microelectronic packages, wherein selected portions of the unpatterned metal-containing epoxy layers are removed at the exposed sidewall surfaces during patterning.

2. A method according to claim 1 wherein removing comprises patterning the unpatterned metal-containing epoxy layers using a laser ablation process.

3. A method according to claim 1 wherein each of the plurality of microelectronic device panels is produced using a process comprising:

embedding microelectronic devices in an encapsulant having a device surface through which the microelectronic devices are exposed; and forming the package edge conductors over the device surface and electrically coupled to the microelectronic devices.

4. A method according to claim 1 further comprising depositing a dielectric material between neighboring ones of the plurality of sidewall conductors.

5. A method according to claim 1 wherein each microelectronic device panels comprises dicing streets to which the plurality of package edge conductors extend, and wherein the step of arranging comprises arranging the device panels in a panel stack such that the dicing streets of the device panels at least partially overlap, as taken along a centerline of the panel stack.

6. A method according to claim 5 wherein forming comprises cutting non-penetrating trenches into the panel stack along the dicing streets and transecting the plurality of package edge conductors.

7. A method according to claim 6 wherein cutting comprises cutting non-penetrating trenches into the panel stack having a first predetermined width, and wherein separating comprises singulating the panel stack into a plurality of stacked microelectronic packages utilizing a saw blade having thickness less than the first predetermined width.

8. A method according to claim 1 wherein the unpatterned paste layers are patterned subsequent to separation of the panel stack into partially-completed stacked microelectronic packages.

9. A method according to claim 1 wherein each microelectronic device panel further comprises one or more layers of dielectric material overlying the plurality of microelectronic devices and in which the plurality of edge conductors extend.

10. A method according to claim 2 wherein the laser ablation process is carried-out at laser energy levels less than about 4 Watts.

11. A method for fabricating a stacked microelectronic package, comprising:

obtaining a partially-completed stacked microelectronic package having at least upper and lower package layers, the upper and lower package layers each comprising:
a package body;
a microelectronic device embedded in the package body; and
one or more dielectric layers overlying the package body and the microelectronic device; and
a plurality of package edge conductors formed in the one or more dielectric layers and extending from the microelectronic device to a sidewall of the stacked microelectronic package, the plurality of package edge conductors exposed through the sidewall of the stacked microelectronic package;

producing an unpatterned metal-containing epoxy layer contacting the plurality of package edge conductors by dispensing a metal-containing epoxy over the sidewall of the package body, curing the metal-containing epoxy, and cutting through the metal-containing epoxy during package singulation; and patterning the unpatterned metal-containing epoxy layer by removing selected portions of the electrically-conductive layer at one or more surfaces created when cutting through the metal-containing epoxy layer during package singulation, the unpatterned metal-containing epoxy layer patterned to produce a plurality of sidewall conductors interconnecting the microelectronic devices included within the upper and lower package layers.

12. A method according to claim 8 wherein the unpatterned paste layers cover at least one side of each partially-completed stacked microelectronic packages.

13. A method according to claim 8 wherein the unpatterned paste layers extend around all four sides of each partially-completed stacked microelectronic packages.

* * * * *